(12) United States Patent
Haji

(10) Patent No.: US 6,331,347 B2
(45) Date of Patent: Dec. 18, 2001

(54) METHOD FOR FORMING A GOLD PLATING ELECTRODE A SUBSTRATE BASED ON THE ELECTRODE FORMING METHOD, AND A WIRE BONDING METHOD UTILIZING THIS ELECTRODE FORMING METHOD (75) Inventor: Hiroshi Haji, Fukuoka (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 0 days.

(21) Appl. No.: 09/052,979

(22) Filed: Apr. 1, 1998

Related U.S. Application Data (62) Division of application No. 08/604,072, filed on Feb. 20, 1996, now Pat. No. 5,762,008.

(30) Foreign Application Priority Data

Feb. 20, 1995 (JP) ........................................ 7-31223

(51) Int. Cl.⁷ .................................................... B32B 3/00
(52) U.S. Cl. ........................... 428/209; 428/901; 174/257
(58) Field of Search ..................... 428/209, 901; 174/257

(56) References Cited

U.S. PATENT DOCUMENTS

| | | | |
|---|---|---|---|
| 3,781,596 | * 12/1973 | Galli et al. | 257/766 |
| 4,016,050 | * 4/1977 | Lesh et al. | 257/766 |
| 4,068,022 | * 1/1978 | Glick | 257/766 |
| 5,232,873 | * 8/1993 | Geva et al. | 438/650 |
| 5,242,861 | * 9/1993 | Inaba | 438/650 |
| 5,302,492 | * 4/1994 | Ott et al. | 430/314 |
| 5,635,764 | * 6/1997 | Fujikawa et al. | 257/766 |
| 5,652,434 | * 7/1997 | Nakamura et al. | 257/766 |
| 5,767,008 | * 6/1998 | Haji | 438/612 |
| 5,909,633 | * 6/1999 | Haji et al. | 438/612 |

FOREIGN PATENT DOCUMENTS 0089559   9/1983   (EP) .
0203423   12/1986  (EP) .

* cited by examiner

Primary Examiner—Cathy Lam
(74) Attorney, Agent, or Firm—Connolly Bove Lodge & Hutz LLP

(57) ABSTRACT

A circuit pattern 2a, made of copper foil, is arranged on a substrate 1. A nickel-containing barrier metal layer 2b is formed on the circuit pattern 2a. A gold layer 2c is formed on the barrier metal layer 2b by electroless substitution plating. Then, substrate 1 is heated up to impel nickel contained in the gold layer 2c to move toward a surface zone of the gold layer 2c to deposit nickel compound in the surface zone of the gold layer 2c, thereby enhancing the fineness of a remaining part of the gold layer 2c at at least an inside zone immediately below the surface zone. Then, the surface zone containing the crowded nickel compound is removed off the gold layer 2c so as to expose a purified surface of the inside zone of the gold layer 2c. Therefore, it becomes possible to form an excellent electrode having satisfactory bondability to the wire by using a less amount of gold at low costs.

8 Claims, 6 Drawing Sheets

METHOD FOR FORMING A GOLD PLATING ELECTRODE A SUBSTRATE BASED ON THE ELECTRODE FORMING METHOD, AND A WIRE BONDING METHOD UTILIZING THIS ELECTRODE FORMING METHOD

CROSS REFERENCE TO RELATED APPLICATIONS

This application is a divisional application based on U.S. appln. Ser. No. 08/604,072, filed Feb. 20, 1996, now issued as U.S. Pat. No. 5,762,008, which issued on Jun. 18, 1998.

BACKGROUND OF THE INVENTION

1. Field of the Invention

The present invention generally relates to a method for forming a gold plating electrode, a substrate based on the gold plating electrode forming method, and a wire bonding method utilizing the gold plating electrode forming method.

2. Prior Art

According to conventional technologies, it has been well known that gold plating is used to form an electrode on a glass epoxy substrate and thus formed electrode is electrically connect with a chip through bonding of a wire. In this case, gold plating must provide sufficient bondability, such as bonding strength, to a ball formed at a distal end of the wire.

From numerous experiences, it has been conventionally believed that the thickness of a gold layer formed by the gold plating needs to be as thick as 300 nanometer or more. To this end, it was usual to utilize the electro plating or electroless reduction plating to form a gold layer being sufficiently thick.

However, as well known to artisans, it takes an extremely long time until a growing gold layer reaches a required thickness when the gold layer is formed by the electro plating or electroless substitution plating, and the manufacturing cost must be expensive.

SUMMARY OF THE INVENTION

Accordingly, in view of above-described problems encountered in the prior art, a principal object of the present invention-is to provide a method for forming a novel and excellent gold plating electrode assuring sufficient bondability without requiring long processing time and expensive manufacturing costs, and to provide a substrate based on the above gold plating electrode forming method, and a wire bonding method utilizing this gold plating electrode forming method.

In order to accomplish this and other related objects, a first aspect of the present invention provides a novel and excellent method for forming a gold plating electrode comprising: a step of forming a circuit pattern on a substrate; a step of forming a nickel-containing barrier metal layer at a portion where an electrode of the circuit pattern is formed; a step of forming a gold layer on the barrier metal layer by plating; a step of heating the substrate to cause nickel contained in the gold layer to move toward a surface zone of the gold layer to deposit nickel compound in the surface zone of the gold layer, thereby enhancing the fineness of a remaining part of the gold layer at at least an inside zone immediately below the surface zone; and a step of removing the surface zone containing the nickel compound off the gold layer so as to expose a purified surface of the inside zone of the gold layer.

According to features of the preferred embodiments, the surface zone containing the nickel compound is removed off by etching. It is preferable that the surface zone containing the nickel compound is removed off by a thickness of 3 to 10 nanometer. The substrate is heated at a temperature of 150 to 200 centigrade for 5 to 60 minutes. The gold layer is formed by plating so as to have a thickness in the range of 5 to 100 nanometer.

A second aspect of the present invention provides a substrate comprising: a circuit pattern formed on a surface of the substrate; a nickel-containing barrier metal layer formed at a portion where an electrode of the circuit pattern is formed; a gold layer formed on-the barrier metal layer by plating, wherein the substrate is heated up to cause nickel contained in the gold layer to move toward a surface zone of the gold layer to deposit nickel compound in the surface zone of the gold layer so that the fineness of a remaining part of the gold layer is enhanced at at least an inside zone immediately below the surface zone, and the surface zone containing the nickel compound is removed off sd as to expose a purified surface of the inside zone of the gold layer.

Furthermore, a third aspect of the present invention provides a wire bonding method comprising: a step of forming a circuit pattern on a substrate, forming a nickel-containing barrier metal layer at a portion where an electrode of the circuit pattern is formed, and forming a gold layer on the barrier metal layer by plating, thereby forming an electrode on the substrate; a step of heating the substrate to cause nickel contained in the gold layer to move toward a surface zone of the gold layer to deposit nickel compound in the surface zone of the gold layer, thereby enhancing the fineness of a remaining part of the gold layer at at least an inside zone immediately below the surface zone; a step of removing the surface zone containing the nickel compound off the gold layer by etching to expose a purified surface of the inside zone of the gold layer; a step of applying an adhesive material on the substrate and die bonding a chip on the adhesive material; and a step of connecting an electrode of the chip to the electrode of the substrate via an electrically conductive wire.

According to this novel and excellent gold plating electrode method. A circuit pattern, which is preferably a copper foil, is formed on a substrate. Next, a nickel-containing barrier metal layer is formed on the copper foil. Then, a gold layer is formed on the barrier metal layer by plating. Thereafter, the substrate is heated up to cause nickel contained in the gold layer to move or shift toward a surface zone of the gold layer, so that nickel compound can be deposited or collected in the surface zone of the gold layer and, as a result, the fineness of the remaining part of the gold layer can be enhanced at at least the inside zone immediately below the surface zone.

Through experiments conducted by an inventor of the present application, it was confirmed that nickel had surely moved from the barrier metal layer into the gold layer even immediately after the gold layer was formed by plating. Furthermore, it was confirmed that heating the substrate promoted or impelled the nickel in the gold layer to move into and deposit as nickel compound in the surface zone, enhancing the fineness of the gold layer at least the inside zone immediately below the surface zone to be sufficiently high to assure a satisfactory bondability to the wire. Accordingly, by removing the nickel compound crowded in the surface zone off the gold layer, it becomes possible to form an excellent gold electrode having high fineness and assuring a satisfactory bondability to the wire.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Preferred embodiments of the present invention will be explained in greater detail hereinafter, with reference to the accompanying drawings. Identical parts are denoted by an identical reference numeral throughout views.

Prior to detailed explanation of steps consisting of a gold plating electrode forming method in accordance with one embodiment of the present invention, result of experiments conducted by the inventor of the present application will be first explained since it is believed that these experimental results will make clear the problem (i.e. insufficient bondability) of a conventional gold electrode formed by the electroless substitution plating.

Figure 2:
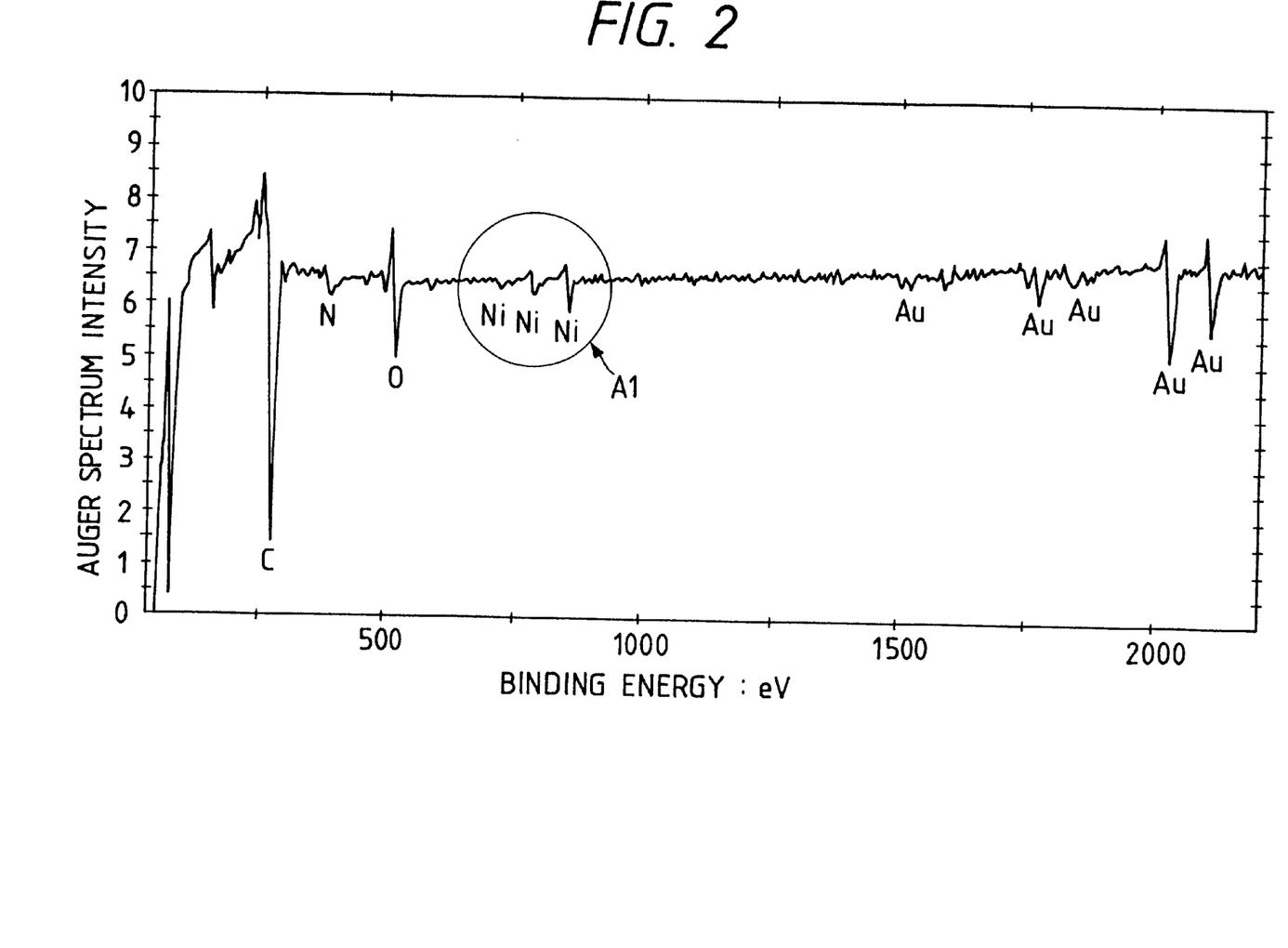
FIG. 2 is a graph showing Auger spectrum intensity of the surface zone of the gold plating electrode, obtained immediately after the formation of the gold plating electrode, in accordance with the one embodiment of the present invention.
Figure 3:
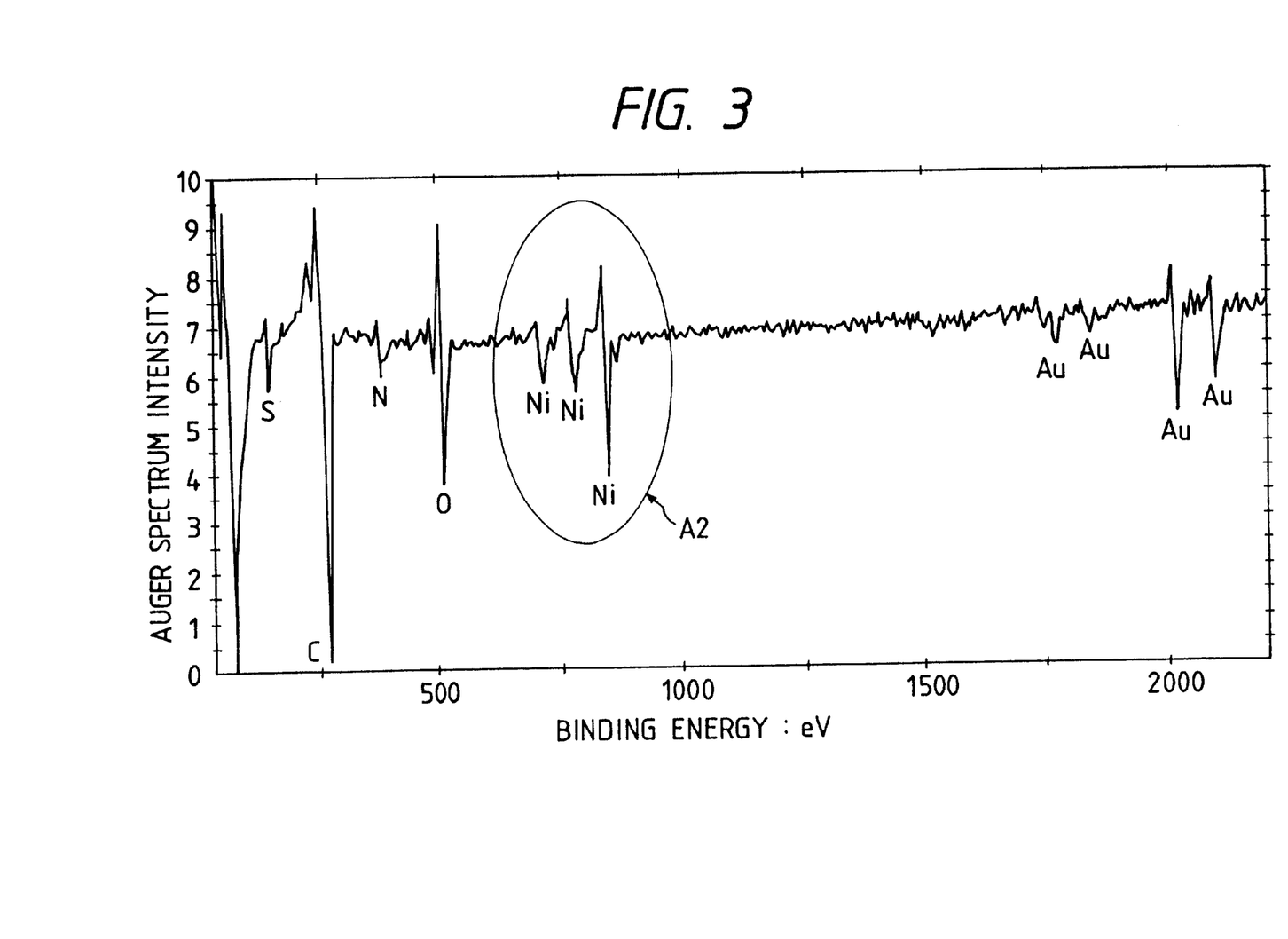
FIG. 3 is a graph showing Auger spectrum intensity of the surface zone of the gold plating electrode, obtained after the heating operation, in accordance with the one embodiment of the present invention.
Figure 4:
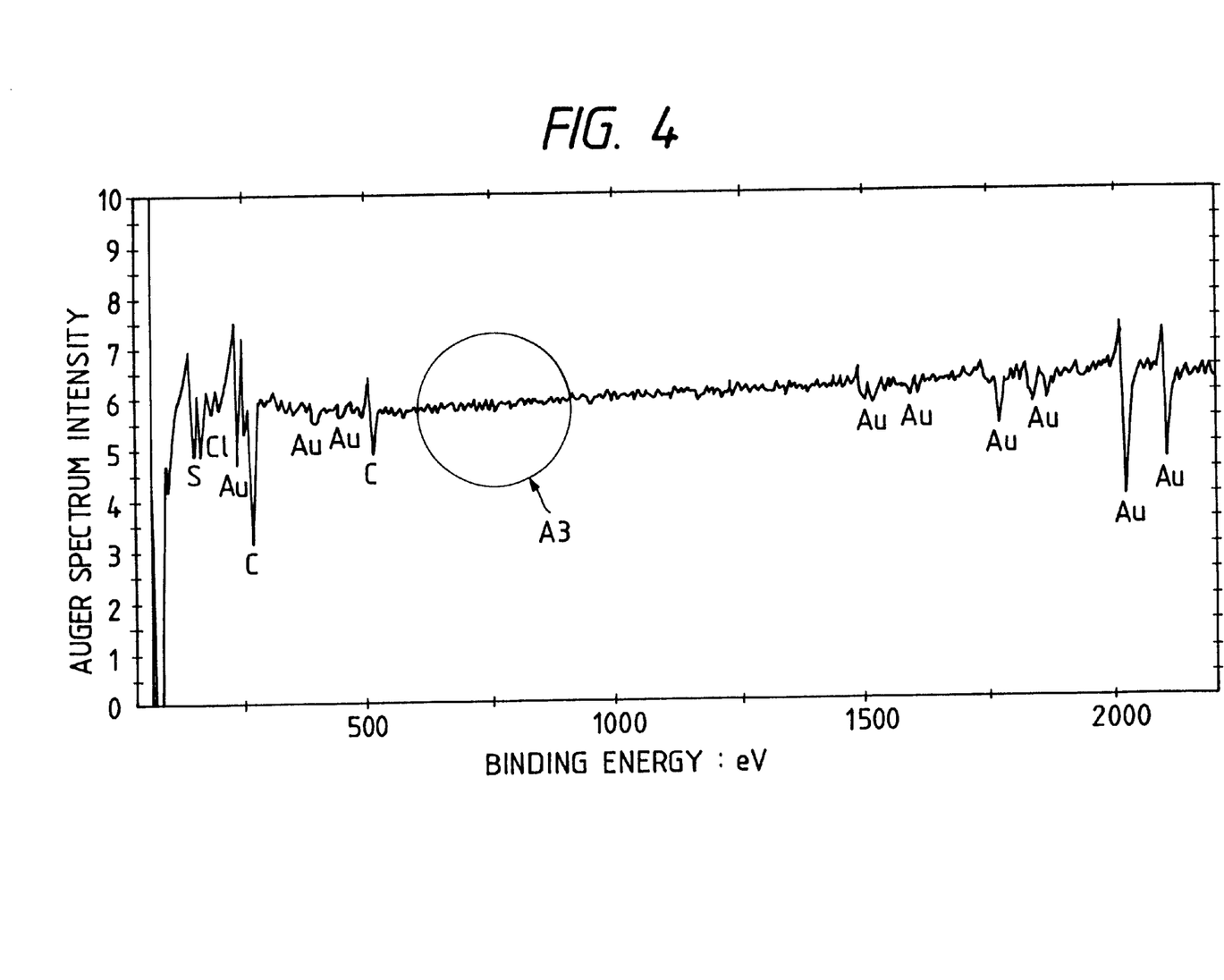
FIG. 4 is a graph showing Auger spectrum intensity of the surface zone of the gold plating electrode, obtained after removal of nickel or nickel compound crowded in the surface zone, in accordance with the one embodiment of the present invention.

FIGS. 2 through 4 are graphs showing Auger spectrum intensity of a surface zone of a gold plating electrode in accordance with one embodiment of the present invention. FIG. 2 shows Auger spectrum intensity of the surface zone of a gold layer which is obtained immediately after a gold plating electrode is formed on a nickel-containing barrier metal layer by the electroless substitution plating. In this case, a copper foil constituting a circuit pattern is formed on a substrate and the nickel-containing barrier metal layer is formed on this copper foil. According to the result of FIG. 2, it is found that a waveform A1 indicating the presence of nickel or nickel compound clearly appears even immediately after the formation of gold plating.

Next, FIG. 3 is Auger spectrum intensity obtained immediately after the substrate showed the Auger spectrum intensity of FIG. 2 is heated at 150° C. for 30 minutes.

Here, the processing of the substrate conducted before and after the wire bonding operation will be explained briefly. First of all, a gold plating electrode is formed. Thereafter, an adhesive material is applied on the substrate, and a chip is die bonded thereon. Then, the substrate is heated under the conditions similar to the above-described conditions to harden the adhesive material and securely fix the chip on the substrate. Subsequently, the wire bonding operation is performed on the substrate.

Accordingly, the substrate having just finished the heating operation is in the same circumstances as the substrate to be immediately carried out the wire bonding operation thereon.

As shown in FIG. 3, it is understood that the waveform A2 indicating the presence of nickel or nickel compound has a large amplitude compared with the waveform A1 of FIG. 2. The amplitude difference between waveforms A1 and A2 proves the fact that nickel or nickel compound is deposited or collected in the surface zone of the gold layer in a concentrated manner by the heating operation performed before the wire bonding operation.

The inventor of the present application has tested the wire bonding formed on the gold plating electrode, (1) immediately after the gold plating electrode is formed and (2) immediately after the heating operation is performed, separately. According to the result of these trials, the resultant bonding is not satisfactory in the former case and too bad in the latter case.

Furthermore, the inventor of the present application has investigated the condition of the gold plating electrode after the heating operation is finished. Still further, FIG. 4 shows Auger spectrum intensity obtained after the surface zone of the gold layer showed the Auger spectrum intensity of FIG. 3 is removed off by a thickness of 5 nanometer by etching.

As apparent from FIG. 4, a resultant waveform A3 indicates that nickel or nickel compound is no longer included. From the comparison between FIGS. 2 and 4, it is found that the removal of the surface zone is effective to enhance the fineness of gold enhance at the region slightly deeper than the surface zone, when it is compared with the fineness obtained immediately after the gold plating is formed.

From the foregoing, it is concluded that the above-described heating operation is effective to deposit or collect almost all of nickel or nickel compound involved in the gold plating electrode into the surface zone in a concentrated or crowded manner. Hence, the fineness of gold can be enhanced in the inside zone of the gold layer deeper than the surface zone.

Furthermore, the inventor of the present application has tested a wire bonding on the gold plating electrode after the surface zone containing nickel or nickel compound therein is removed off. According to the test result, an excellent bondability was attained. From this fact, it is confirmed that nickel or nickel compound concentrated in the surface zone of the gold layer worsened the bondability to the wire. In other words, by removing the nickel or nickel compound concentrated in the surface zone of the gold layer, it becomes possible to expose the highly purified gold layer located under the surface zone and improve the bondability to the wire. Moreover, a detailed study on binding energy revealed that the nickel compound crowded in the surface zone of the gold layer chiefly comprised $Ni(OH)_2$, $Ni_2O_3$ and NiO.

Figure 5:
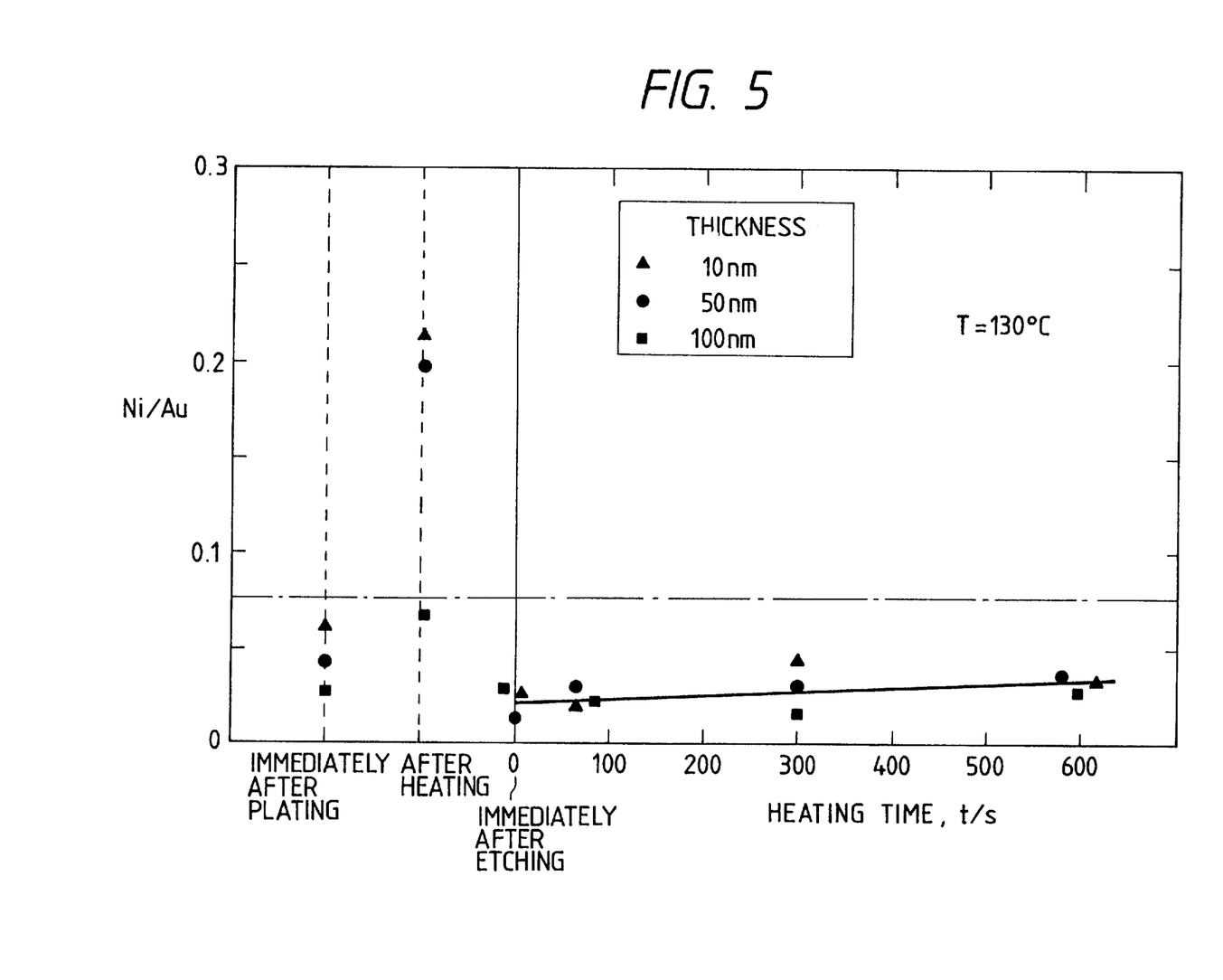
FIG. 5 is a graph showing the ratio of nickel to gold in the gold plating electrode in accordance with the one embodiment of the present invention.

FIG. 5 shows the ratio of nickel to gold in each process of the gold plating electrode formation. The inventor of the present application has conducted experiments on three kinds of gold layers, a 10-nanometer-thick gold layer (indicated by triangular marks), a 50-nanometer-thick gold layer (indicated by circular marks) and a 100-nanometer-thick gold layer (indicated by rectangular marks).

As shown in FIG. 5, the ratio of nickel to gold in the surface zone of the gold layer is explicitly increased by the heating operation which is started immediately after finishing the plating under the above-described conditions. On the other hand, the ratio of nickel to gold is extremely lowered (below 0.05) after the surface zone containing the concentrated nickel or nickel compound is removed off the gold layer by etching.

Thereafter, even if the gold layer is heated continuously at 130° C., the ratio of nickel to gold does not cause a substantial increase and thus remains at lower values. That is, removing the nickel or nickel compound concentrated in the surface zone from the gold layer by etching makes it possible to maintain an exposed surface having a higher ratio of gold even if the gold layer is later subjected to a continuous heating operation.

Similar results are preferably obtained on any gold layer when its thickness is somewhere between 10 to 100 nanometer. These results show a remarkable progress compared with a conventional gold plating electrode forming method when such a conventional method needs a gold layer having a thickness of 300 nanometer or more which requires a significant long time and expensive costs to form.

As apparent from the foregoing description, it is confirmed that an excellent gold plating electrode can be fabricated by plating a gold layer at a thickness (for example, less than 100 nanometer) smaller than the plating thickness (300 nanometer or more) of a conventionally required gold layer. More specifically, a gold plating electrode is formed by plating (for example, by the electroless substitution plating), and is heated. And then, the surface zone is removed off the main part of the gold layer by etching. Once the surface zone is removed off, the ratio of nickel to gold is no longer increased even if the gold layer is continuously heated, maintaining a higher fineness of gold at the exposed surface of the gold layer.

Taking the above-described experimental results into consideration, the inventor of the present application has reached the inventive concept to be realized as a method for forming a gold plating electrode and a related substrate based on this forming method.

FIGS. 1A to 1F are views illustrating respective processes of the gold plating electrode forming method in accordance with one embodiment of the present invention.

Figure 1A:
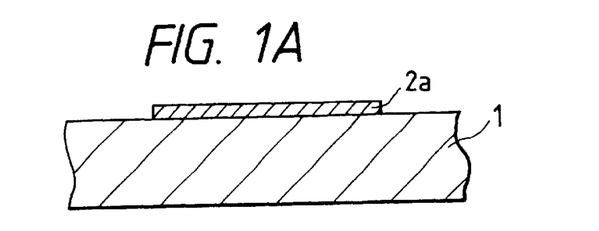
FIG. 1A is a view showing a circuit pattern forming process of the electrode forming method in accordance with one embodiment of the present invention.
Figure 1B:
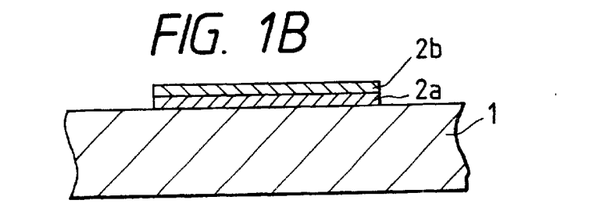
FIG. 1B is a view showing a barrier metal layer forming process of the electrode forming method in accordance with one embodiment of the present invention.

First of all, as illustrated in FIG. 1A, a circuit pattern 2a is formed on a surface of a substrate 1 using a copper foil having a thickness of 18 to 35 micrometer. Next, as illustrated in FIG. 1B, a nickel-containing barrier metal layer 2b having a thickness of 3 to 5 micrometer is formed on the circuit pattern 2a at a portion serving as an electrode.

Figure 1C:
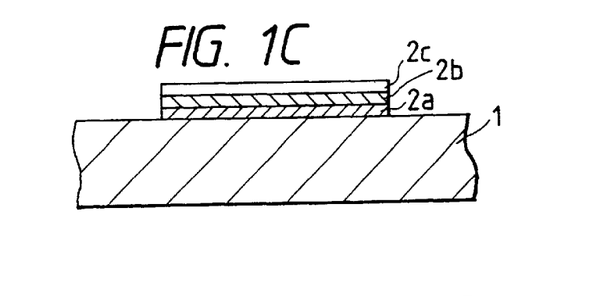
FIG. 1C is a view showing a gold layer forming process of the electrode forming method in accordance with one embodiment of the present invention.
Figure 1D:
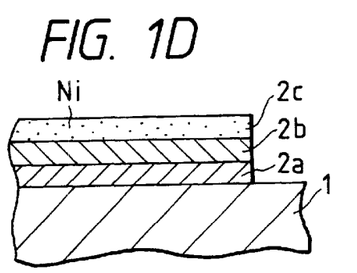
FIG. 1D is a view showing a before-heating condition of the electrode forming method in accordance with one embodiment of the present invention.
Figure 1E:
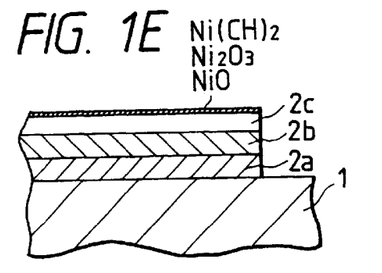
FIG. 1E is a view showing an after-heating condition of the electrode forming method in accordance with one embodiment of the present invention.

Next, as illustrated in FIG. 1C, a gold layer 2c having a thickness of 10 to 100 nanometer is formed on the barrier metal layer 2b by the electroless substitution plating (so-called flash plating). In this case, as illustrated in FIG. 1D, the gold layer 2c contains nickel or nickel compound which was originally contained in the barrier metal layer 2b.

The electroless substitution plating used in this embodiment to form gold layer 2c can be replaced by any other plating method, such as electro plating. However, the electro plating is not desirable in that fine and complicated wiring is required and this fine and complicated wiring may interfere with the inherently required wiring of the circuit pattern or may cause undesirable antenna effects. Thus, it is recommendable to use the electroless substitution plating.

Figure 1F:
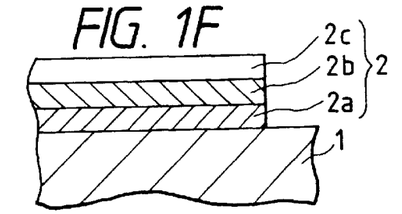
FIG. 1F is a view showing a finally obtained electrode in accordance with one embodiment of the present invention.

Next, substrate 1 is heated, for example, at 150° C. for 30 minutes. Through this heating operation, nickel or nickel compound existing in the gold layer 2c moves toward and is deposited in a concentrated manner in the surface zone of the gold layer 2c. Then, as illustrated in FIG. 1F, the surface zone is removed off the gold layer 2c by a thickness of 3 to 10 nanometer, for example 5 nanometer, by etching. Through this etching operation, almost all of nickel or nickel compound crowded near the surface of the gold layer 2c can be removed off together with the surface zone. Thus, an exposed surface of gold layer 2c is a highly purified gold surface. Dry etching will be preferably used for the etching in this embodiment; however, it is needless to say that wet etching can be equivalently used.

Next, explained hereinafter with reference to FIGS. 6A through 6E is the processes for forming a wire bonding on the substrate 1 after the electrode 2 is formed on the substrate 1 in accordance with the present invention.

Figure 6A:
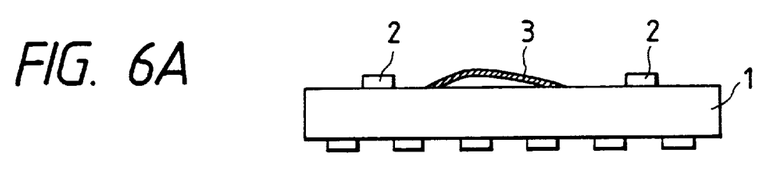
FIG. 6A is a view showing a bond applying step of an electronic component manufacturing method in accordance with the one embodiment of the present invention.
Figure 6B:
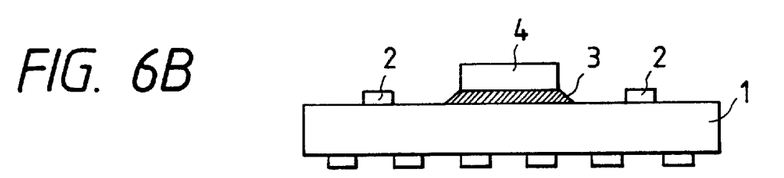
FIG. 6B is a view showing a chip mounting step of the electronic component manufacturing method in accordance with the one embodiment of the present invention.

When the highly purified gold layer 2c is exposed by removing the surface zone containing the crowded nickel compound off the gold layer 2c by etching as described above, an adhesive material 3 is applied on the upper surface of substrate 1 between electrodes 2 (refer to FIG. 6A). Then, as illustrated in FIG. 6B, a chip 4 is die bonded on the applied adhesive material 3.

Figure 6C:
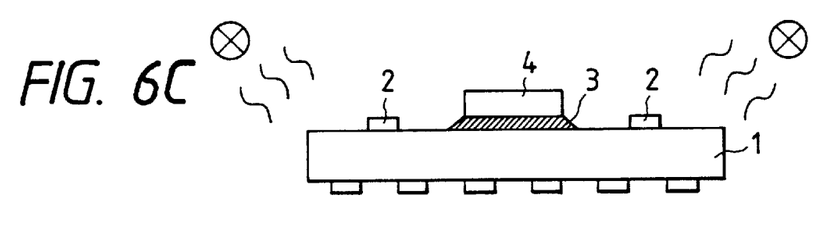
FIG. 6C is a view showing a heating step of the electronic component manufacturing method in accordance with the one embodiment of the present invention.

Subsequently, as illustrated in FIG. 6C, substrate 1 is entered in and heated by a cure apparatus. In this case, as explained previously, the ratio of nickel to gold is not substantially increased through this heating operation. Thus, bondability can be maintained at satisfactory values.

Figure 6D:
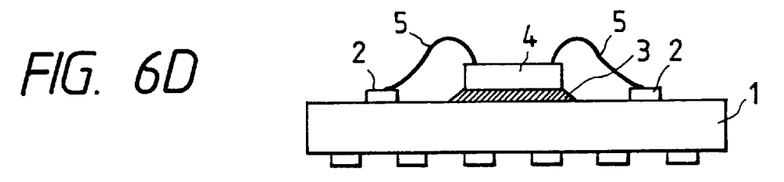
FIG. 6D is a view showing a wire bonding step of the electronic component manufacturing method in accordance with the one embodiment of the present invention.
Figure 6E:
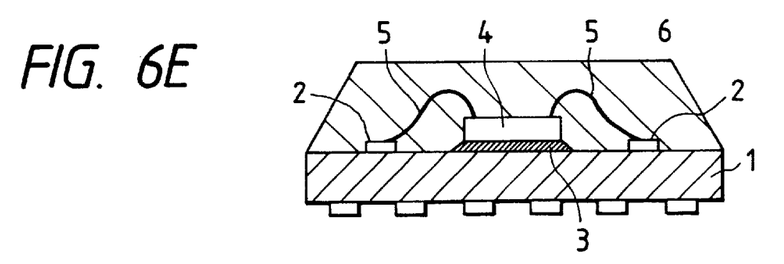
FIG. 6E is a view showing a sealing step of the electronic component manufacturing method in accordance with the one embodiment of the present invention.

Next, as illustrated in FIG. 6D, the chip 4 and adjacent electrodes 2 are bonded via wires 5. Then, as illustrated in FIG. 6E, the assembly of chip 4, wires 5 and electrodes 2 is sealed by resin 6.

Although the present invention is explained based on the above-described embodiment, it is possible to add various modifications to the above-described embodiments. For example, regarding the above-described heating operation performed after the formation of gold layer 2c on the barrier metal layer 2b, it will be desirable to set the heating temperature somewhere in the range of 150 to 200° C. and to set the heating time somewhere in the range of 5 to 60 minutes. In summary, it is recommendable to perform the heating operation under the conditions which surely impel nickel contained in the gold layer 2c to move into the surface zone of the gold layer 2c. The substrate 1 can be replaced by a substrate made of other material, such as a ceramic substrate.

As apparent from the foregoing description, the present invention provides a method for forming a gold plating electrode comprising: a step of forming a circuit pattern on a substrate; a step of forming a nickel-containing barrier metal layer on the circuit pattern; a step of forming a gold layer on the barrier metal layer by plating; a step of heating the substrate to cause nickel contained in the gold layer to move toward a surface zone of the gold layer, thereby enhancing the fineness of a remaining part of the gold layer at at least an inside zone immediately below the surface zone and depositing nickel or nickel compound in the surface zone of the gold layer; and a step of removing the surface zone containing the crowded nickel or nickel compound off the gold layer so as to expose a purified surface of the inside zone of the gold layer. Therefore, it becomes possible to form an excellent electrode having a satisfactory bondability to the wire by using a less amount of gold at low costs.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A substrate comprising:

a circuit pattern formed on a surface of said substrate;

a nickel-containing barrier metal layer formed at a portion where an electrode of said circuit pattern is formed;

a gold layer formed on said barrier metal layer by plating to a thickness of at least 5 nm and less than 100 nm, wherein said substrate is heated up to cause nickel contained in said gold layer to move toward a surface zone of said gold layer to deposit nickel compound in said surface zone of said gold layer so that the fineness of a remaining part of said gold layer is enhanced at, at least, an inside zone immediately below said surface zone, and said surface zone containing said nickel compound is removed to expose a purified gold surface of said inside zone of said gold layer having a ratio of nickel to gold concentration of less than 0.05.

2. A substrate according to claim 1, wherein said surface zone containing said nickel compound is removed by etching.

3. A substrate according to claim 1, wherein said surface zone containing said nickel compound is removed by a thickness of 3 to 10 nanometer.

4. A substrate according to claim 1, wherein said substrate is heated at a temperature of 150 to 200 centigrade for 5 to 60 minutes to cause the nickel to move to said surface zone.

5. The substrate according to claim 1, wherein:

said gold layer thickness plated on said barrier metal layer is no greater than 75 nm.

6. The substrate according to claim 1, wherein:

said gold layer thickless plated on said barrier metal layer is no greater than 50 nm.

7. The substrate according to claim 1, wherein:

said gold layer thickness plated on said barrier metal layer is no greater than 25 nm.

8. The substrate according to claim 1, wherein:

said gold layer thickness plated on said barrier metal layer is no greater than 12.5 nm.

* * * * *

UNITED STATES PATENT AND TRADEMARK OFFICE
CERTIFICATE OF CORRECTION

PATENT NO.    : 6,331,347 B2
DATED         : December 18, 2001
INVENTOR(S)   : Hiroshi Haji It is certified that error appears in the above-identified patent and that said Letters Patent is hereby corrected as shown below:

<u>Title page,</u>
Item [62], change "Pat. No. 5,762,008" to -- Pat. No. 5,767,008 --.

Signed and Sealed this

Sixteenth Day of September, 2003

JAMES E. ROGAN
*Director of the United States Patent and Trademark Office*